US007656158B2

(12) United States Patent
Fey et al.

(10) Patent No.: US 7,656,158 B2
(45) Date of Patent: Feb. 2, 2010

(54) SAMPLE HOLDER FOR NMR MEASUREMENTS WITH FIELD HOMOGENIZATION IN THE SAMPLE VOLUME BY MEANS OF THE BORDERING SURFACES OF THE SAMPLE HOLDER

(75) Inventors: Michael Fey, Hornussen (CH); Thomas Speck, Thalwil (CH)

(73) Assignee: Bruker Biospin AG, Faellanden (CH)

( * ) Notice: Subject to any disclaimer, the term of this patent is extended or adjusted under 35 U.S.C. 154(b) by 283 days.

(21) Appl. No.: 11/907,417

(22) Filed: Oct. 12, 2007

(65) Prior Publication Data
US 2008/0106263 A1 May 8, 2008

(30) Foreign Application Priority Data
Nov. 4, 2006 (DE) .................. 10 2006 052 076

(51) Int. Cl.
*G01V 3/00* (2006.01)
(52) U.S. Cl. ..................................... 324/321
(58) Field of Classification Search ......... 324/300–322; 600/410–435
See application file for complete search history.

(56) References Cited

U.S. PATENT DOCUMENTS

| 2,878,444 | A | * | 3/1959 | Feher ........................ 324/321 |
| 4,549,136 | A | | 10/1985 | Zens |
| 5,221,903 | A | * | 6/1993 | Kasten et al. ............... 324/321 |
| 5,266,896 | A | * | 11/1993 | Rugar et al. ................ 324/307 |
| 5,302,900 | A | | 4/1994 | Cummings |
| 5,408,178 | A | * | 4/1995 | Wikswo et al. ............. 324/201 |
| 5,831,434 | A | | 11/1998 | Shigezane |
| 6,064,206 | A | * | 5/2000 | Van Vaals et al. ........... 324/312 |
| 6,501,272 | B1 | * | 12/2002 | Haacke et al. ............... 324/306 |
| 6,605,945 | B2 | * | 8/2003 | Marek ........................ 324/318 |
| 6,696,838 | B2 | * | 2/2004 | Raftery et al. .............. 324/321 |
| 6,765,144 | B1 | * | 7/2004 | Wang et al. .................... 174/36 |

(Continued)

FOREIGN PATENT DOCUMENTS

| EP | 0 285 853 | 10/1988 |
| JP | 06-249934 | 9/1994 |

OTHER PUBLICATIONS

Anonymous "NMR Sample Tubes", Sample Tube Quality/Application Note, [Online] Oct. 4, 2006 URL:http://web.archive.org/web/20061004014954/http://mrr.com/>.

(Continued)

*Primary Examiner*—Brij B Shrivastav
*Assistant Examiner*—Dixomara Vargas
(74) *Attorney, Agent, or Firm*—Paul Vincent

(57) ABSTRACT

A sample vessel (80) made of material with magnetic susceptibility $\chi_2$, for containing a sample substance (87) with magnetic susceptibility $\chi_3 \neq \chi_2$ to be analyzed in a nuclear magnetic resonance (NMR) spectrometer, has an inner interface $G_2$ toward the sample substance and an outer interface $G_1$ toward the environment (85) that exhibits magnetic susceptibility $\chi_1$. The shape of the interface toward the sample substance and the interface toward the environment are coordinated to match the discontinuities in susceptibility at the interfaces in such a way that on introduction of the sample tube filled with sample substance into the previously homogeneous magnetic field of an NMR spectrometer, the magnetic field inside the sample substance remains largely homogeneous.

16 Claims, 12 Drawing Sheets

U.S. PATENT DOCUMENTS

| | | | |
|---|---|---|---|
| 6,833,701 B2 * | 12/2004 | Marek | 324/307 |
| 7,088,101 B2 * | 8/2006 | Mett et al. | 324/321 |
| 7,535,227 B1 * | 5/2009 | Koch et al. | 324/309 |
| 2005/0024055 A1 | 2/2005 | Cavaluzzi | |

OTHER PUBLICATIONS

Leroy J-L et al: "Solution structures of the i-motif tetramers of d(TCC),d(5methylCCT) and d(T5methylCC):.novel NOE connections between amino protons and sugar protons". Structure, Current Biology-Ltd., Philadelphia, PA, US, vol. 3, Nr. 1, Jan. 1995, Pa. 101-120.

Kuchel PW et al: "Magnetic susceptibility: Solutions, emulsions and cells". Concepts in Magnetic Resonance Part A, vol. 18A, 2003, Pa. 56-71.

Durrant CL et al: "Magnetic susceptibility: Further insights into macroscopic and microscopic fields and the sphere of Lorentz". Concepts in Magnetic Resonance Part A, vol. 18A, 2003, Pa. 72-95.

Schott Duran Laboratory glassware catalogue 2005/2006.

James Clerk Maxwell "A Treatise on Electricity and Magnetism", Dover, New York, 1954, pp. 66-70.

Reinhard Ulrich et al. "Susceptibility corrections in solid state NMR experiments with oriented membrane samples". J. Magn. Res. 164 (2003) 115-127.

J.A. Osborn "Demagnetizing Factors of the General Ellipsoid". Physical Review, vol. 67, No. 11 and 12 Jun. 1 and 15, 1945, p. 351.

* cited by examiner

SAMPLE HOLDER FOR NMR MEASUREMENTS WITH FIELD HOMOGENIZATION IN THE SAMPLE VOLUME BY MEANS OF THE BORDERING SURFACES OF THE SAMPLE HOLDER

This application claims Paris Convention priority of DE 10 2006 052 076.9 filed Nov. 4, 2006 the complete disclosure of which is hereby incorporated by reference.

BACKGROUND OF THE INVENTION

The invention relates to a sample vessel for NMR measurements, comprising a vessel material of magnetic susceptibility $\chi_2$, with an outer interface that delimits the sample vessel with respect to the environment, and with an inner interface that delimits the sample vessel with respect to the sample volume, wherein the outer interface comprises an outer cylindrical surface that is a cylinder envelope whose axis of symmetry is aligned parallel with a z-direction,
  and an outer closing surface that closes the bottom of the sample vessel and is joined to the outer cylindrical surface, wherein the inner interface comprises an inner cylindrical surface that is a cylinder envelope whose axis of symmetry is aligned parallel with the z-direction,
  and an inner closing surface that closes the sample volume at the lower end and is joined to the inner cylindrical surface.

Such a sample vessel has become known through SCHOTT Duran Laboratory Glassware Catalog 2005/2006, p. 62.

NMR spectroscopy is a method of instrumental analysis with which a measurement sample is exposed to a strong static magnetic field. The measurement sample is then exposed to electromagnetic pulses and the reaction of the atomic nuclei in the measurement sample is measured and analyzed.

One prerequisite for high-quality measurement results is good homogeneity of the static magnetic field in the measurement sample. The measurement sample (usually a substance dissolved in a solvent such as acetone or water, that is, a liquid sample) is held in a sample vessel. Inside, the sample vessel generally distorts the magnetic field that is homogeneous and static outside, potentially resulting in measurement results of poorer quality.

In the case of standard sample vessels, such as are familiar from the SCHOTT Duran Glassware Catalog, the sample vessel has a section shaped as a cylinder envelope and a bowl-shaped section closing the end; the wall thickness is essentially constant throughout. Whereas the section having the shape of a cylinder envelope causes only minor distortions, the closing section can produce strong field distortions. Distortion of the magnetic field is avoided by using only a small portion of the sample volume as the measured volume (sample volume=region of the sample vessel filled with measurement sample) and at a sufficient distance from the closing section. Thus, only a small part of the available mass of the sample is actually measured, which results in a poorer signal-to-noise ratio. This is particularly significant if only a small quantity of the sample substance is available and it has to be diluted to fill the entire sample volume.

Further, sample vessels are already known, wherein the space between the lower end of the sample vessel and the measured region is solid, avoiding the need to fill this space with the substance to be measured. However, in this case, the inner interface between the sample vessel and the measurement sample (usually a liquid sample) can cause magnetic field distortions in the sample volume. From [2], it is known that the magnetic susceptibility of the material of the sample vessel may be chosen in accordance with the magnetic susceptibility of the liquid sample in order to reduce distortions [2]. However, it is difficult and expensive to adjust the susceptibility of the material of the sample vessel. It is also known that the inner interface of the sample vessel may be shaped as a spheroid, for example, by having a spherical shape [4] or by insertion of shaping inserts [5], which also reduces distortions.

In all these sample vessels, the lower end of the sample vessel must be far from the measured region, such as the interior of an RF resonator system, to avoid distortions of the static magnetic field in the measured region. Consequently, it is necessary to leave enough space in the measurement probe below the measured region for the lower end of the sample vessel.

By contrast, the objective of this invention is to present a sample vessel in whose sample volume a high homogeneity of the static magnetic field can be achieved essentially everywhere, permitting a more compact measurement probe.

SUMMARY OF THE INVENTION

This problem is solved by a sample vessel of the type stated initially characterized in that, the outer interface and the inner interface are constituted such that, on positioning the sample vessel in an environment with magnetic susceptibility $\chi_1$, in the presence of a liquid sample of magnetic susceptibility $\chi_3$ in the sample volume, and on application of an external homogeneous magnetic field $B_0$ parallel to the z-axis, the following applies:

due to the jump in susceptibility from $\chi_1$ to $\chi_2$ in the region of the sample volume, the outer interface causes a field $B_z^{(1)}$ with an average value in the sample volume $<B_z^{(1)}>$ and therefore a first relative field change $F1=(B_z^{(1)}-<B_z^{(1)}>)/B_0$ that, in at least part of the sample volume, has an absolute value of no less than $0.5 \cdot 10^{-6}$;

due to the jump in susceptibility from $\chi_2$ to $\chi_3$ in the region of the sample volume, the inner interface causes a field $B_z^{(2)}$ with an average value in the sample volume $<B_z^{(2)}>$ and therefore a second relative field change $F2=(B_z^{(2)}-<B_z^{(2)}>)/B_0$ that, in at least part of the sample volume, has an absolute value of no less than $0.5 \cdot 10^{-6}$, the first relative field change F1 and the second relative field change F2 largely cancel each other in the sample volume V, so that the following applies $$\sqrt{\int_V (F1+F2)^2 \, dV} \leq 0.9 \cdot \sqrt{\int_V (F3)^2 \, dV}$$

where, due to a jump in susceptibility from $\chi_1$ to $\chi_3$ in the region of the sample volume, the inner interface would cause a field $B_z^{(3)}$ with an average value in the sample volume $<B_z^{(3)}>$ and therefore a third relative field change $F3=(B_z^{(3)}-<B_z^{(3)}>)/B_0$.

The central aspect of this invention is to coordinate the geometry of the outer interface and the inner interface such that the relative magnetic field changes caused by the geometry in the sample volume largely cancel each other out. As a yardstick, a fictitious field change F3 in the sample volume due to the liquid sample alone is used (alternately, a comparison with a fixed value for the maximum relative field change can be used, for example, $|F1+F2| \leq 0.5*10^{-6}$ throughout the sample volume). For the inventive coordination of the outer and inner interface, a suitable shape for the outer and inner closing surfaces is frequently sufficient.

According to the invention, the outer and inner closing surfaces can and must remain close together (typically so that the maximum distance parallel to the z-direction is less than or equal to the diameter of the outer cylindrical surface of the sample vessel); an outer closing surface that is too far from the sample volume could not have a sufficient compensatory effect. In any case, according to the invention, the sample vessel protrudes only slightly below the measured region, if at all. The lower part (near to the closing surface) of the sample volume can also be used in an NMR measurement because good homogeneity of the magnet field is ensured at this location by means of the invention.

According to the invention, the geometry of the sample vessel, especially the shapes of the outer and inner closing surfaces, is coordinated with the susceptibilities of environment $\chi_1$ (for example, air or nitrogen), of the material of the sample vessel $\chi_2$ (for example, various types of glass), and of the liquid sample $\chi_3$ (for example, different solvents such as water or acetone). According to the invention, a set of sample vessels can be made, each sample vessel being coordinated for a different combination of environment and liquid sample. A sample vessel is used for precisely the combination of environment and liquid sample for which it is coordinated. Any susceptibility of the material of the sample vessel is possible within specific constraints but this susceptibility is typically not varied within one set of sample vessels.

With the inventive sample vessel, much better NMR results can be achieved with a reduced sample volume. At the same time, a more compact design of the measurement probe and shortening of the sample vessel are enabled.

An especially preferred embodiment of the inventive sample vessel is one for which the following applies $$\sqrt{\int_V (F1+F2)^2 \, dV} \leq 0.5 \cdot \sqrt{\int_V (F3)^2 \, dV},$$

and, in particular, for which $$\sqrt{\int_V (F1+F2)^2 \, dV} \leq 0.1 \cdot \sqrt{\int_V (F3)^2 \, dV}.$$

applies. In this case, the compensatory effect is enhanced, further improving the quality of the NMR measurements.

In a further preferred embodiment, $|F1+F2| \leq 0.5 \cdot 10^{-6}$ and, in particular, $|F1+F2| \leq 0.1 \cdot 10^{-6}$ apply throughout the sample volume. This also ensures an enhanced compensatory effect that further improves the quality of the NMR measurements.

In an especially preferred embodiment, the following applies: $\chi_2 \chi_3 > 0$ and $|\chi_2| > |\chi_3|$ in particular, where $|\chi_2|/|\chi_3| > 1.1$. These relations can easily be achieved by a suitable choice of material for the sample vessel. If these relations are adhered to, sufficient and opposite field changes due to the inner and outer interfaces are easily achieved.

In a preferred embodiment, the sample vessel is made of borosilicate glass or quartz glass. These materials have proven their effectiveness in practice and also exhibit magnetic susceptibilities that are convenient for the invention.

In a highly preferred embodiment, the sample vessel is rated with respect to $\chi_1$ for an environment of air, nitrogen gas, or an inert gas, in particular, argon. These environments are frequently found in laboratory practice.

In a further highly preferred embodiment, the sample vessel is designed for a liquid sample solvent of water or acetone with respect to $\chi_3$. The solvent usually predominates in the magnetic susceptibility of a liquid sample. Water and acetone are also frequently used in laboratory practice.

In a preferred embodiment, the sample vessel is rotationally symmetric with respect to the z-direction. This permits reduction of the angle-dependent field homogeneities by rotating the sample.

In a highly preferred embodiment of an inventive sample vessel, the outer closing surface and the inner closing surface are each semi-ellipsoidal, a semi-ellipsoid being defined as a spheroid that is halved perpendicular to its axis of revolution, that the outer interface and the inner interface each make the transition from the closing surface to the cylindrical surface at the same position in the z-direction, and that the following approximately applies:

$$(\chi_2-\chi_1)(1-g(\alpha_1))=-(\chi_3-\chi_2)(1-g(\alpha_2)),$$

where $\alpha_1$=aspect angle of the semi-ellipsoid of the outer closing surface, $\alpha_2$=aspect angle of the semi-ellipsoid of the inner closing surface, $$g(\alpha_1) = 1 - \frac{\tan(\alpha_1) \cdot \ln\left(\tan(\alpha_1) + \sqrt{\tan(\alpha_1)^2 - 1}\right)}{(\tan(\alpha_1)^2 - 1)^{3/2}} + \frac{1}{\tan(\alpha_1)^2 - 1},$$

$$g(\alpha_2) = 1 - \frac{\tan(\alpha_2) \cdot \ln\left(\tan(\alpha_2) + \sqrt{\tan(\alpha_2)^2 - 1}\right)}{(\tan(\alpha_2)^2 - 1)^{3/2}} + \frac{1}{\tan(\alpha_2)^2 - 1}.$$

The sample vessels of this embodiment achieve good magnetic homogeneity throughout the sample volume and do not require any significant extension below the measured region.

In a preferred further variant of this embodiment, the following applies $$(\chi_2-\chi_1)(1-g(\alpha_1))=-(\chi_3-\chi_2)(1-g(\alpha_2)) \cdot U,$$

where $0.95 \leq U \leq 1.05$, and in particular, $0.99 \leq U \leq 1.01$. These approximations are sufficient to achieve good homogeneity of the sample volume in practice.

In a specially preferred embodiment, the inner closing surface and the outer closing surface are no more than 3 mm apart in the z-direction. With this maximum distance, a good compensatory effect can still be achieved in the sample volume with the outer closing surface. Note that the measured volume according to the invention typically extends as far as the inner closing surface, and therefore the extension of the sample vessel below the measured volume is only very small (not more than 3 mm in this embodiment).

This invention also includes a method for determining the shape of the outer and inner interfaces of an inventive NMR sample tube, characterized by the following steps:

Definition of parameters that define the shape of the interfaces

Definition of a cost function that can be calculated for any combination of parameters and is constituted such that the smaller values of the cost function describe an improvement in field homogeneity, wherein the cost function includes a term $$-\sqrt{\int_V (F1 + F2)^2 \, dV}$$

where F1, F2 and V are defined as in Claim 1

Application of a numerical optimization algorithm for determining a set of parameters that define a minimum of the cost function. By this method, inventive sample vessel geometries can be easily found.

Further advantages of the invention derive from the description and the drawings. The features stated above and below can each be used singly or multiply in any combination. The embodiments shown and described are not to be understood as an exhaustive list but as examples to describe the invention.

The invention is illustrated and explained in more detail in the drawing. Content of the figures:

BRIEF DESCRIPTION OF THE DRAWING

FIG. 4b a graph to explain the relative field change on the axis of the solid of revolution shown in FIG. 4a;

FIG. 5b a graph to explain the relative field change, in particular, F3, inside the inventive sample vessel shown in FIG. 5a;

FIG. 5c a graph to explain the relative field changes, in particular, F1 and F2, inside the inventive sample vessel shown in FIG. 5a;

FIG. 6b a graph to explain the relative field change, in particular, F3, inside the inventive sample vessel shown in FIG. 6a;

FIG. 6c a graph to explain the relative field changes, in particular, F1 and F2, inside the inventive sample vessel shown in FIG. 6a;

DESCRIPTION OF THE PREFERRED EMBODIMENT

Figure 1:
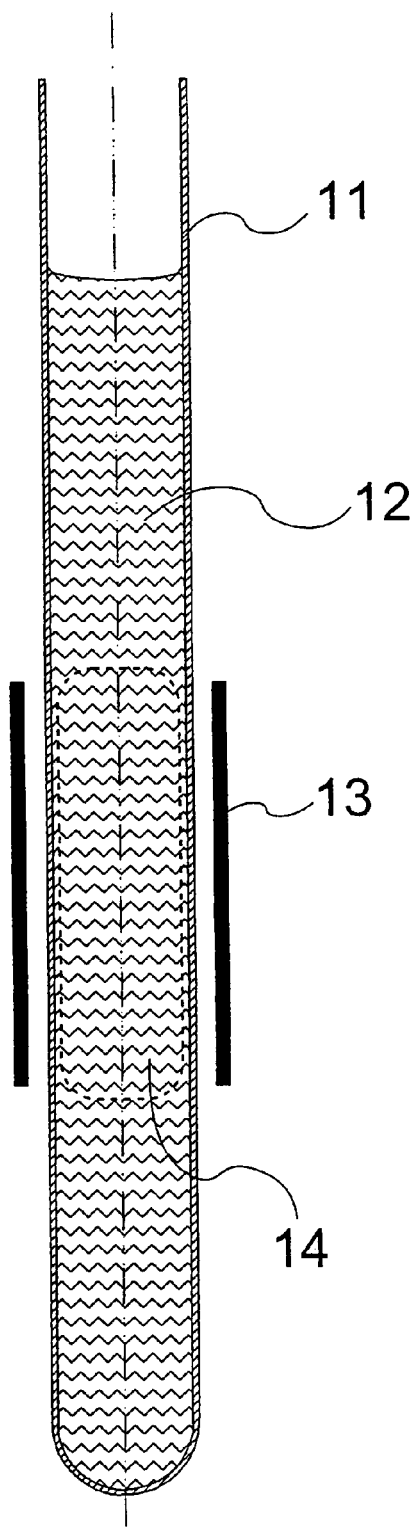
FIG. 1 a schematic cross-section through an NMR sample vessel according to the prior art, with constant wall thickness.

FIG. 1 shows a longitudinal section through the typical shape of a sample vessel used in high-resolution NMR spectroscopy (11) that is filled with a sample substance (12). The three-dimensional geometry of the vessel must be thought of as being rotationally symmetrical around the axis indicated by the dot-and-dash line. A radial section through the RF coil (13) outside the sample vessel is indicated. The extent of the RF coil in the longitudinal direction determines the portion of the volume (14) of the liquid to be analyzed that will contribute to the NMR signal. The extent of this portion of the volume (measured region) (14) is indicated by a dashed line. The sample vessel shape shown here is used if a sufficient quantity of sample substance is available.

FIG. 2 shows a longitudinal section through known sample vessels that permit a reduced volume of liquid without causing a magnetic field inhomogeneity inside the sample volume.

Figure 2A:
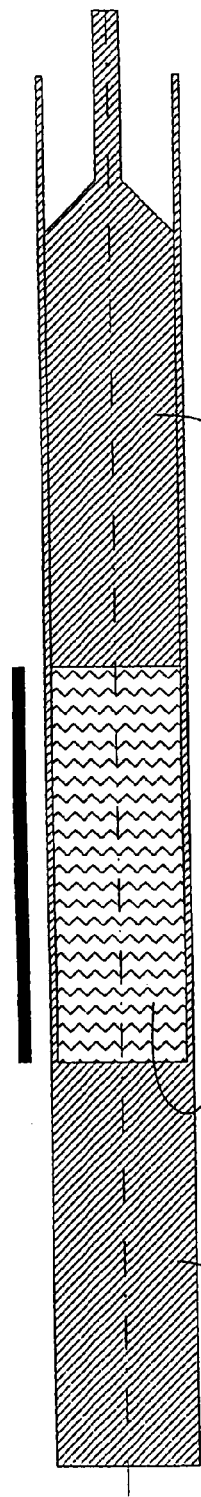
FIG. 2a a schematic cross-section through an NMR sample vessel according to the prior art according to [2]

FIG. 2a shows a sample vessel according to the patent of Shigezane. The magnetic susceptibility of the container (21) and the closed end (22) are chosen such that they just about correspond to the magnetic susceptibility of the sample substance (23).

Figure 2B:
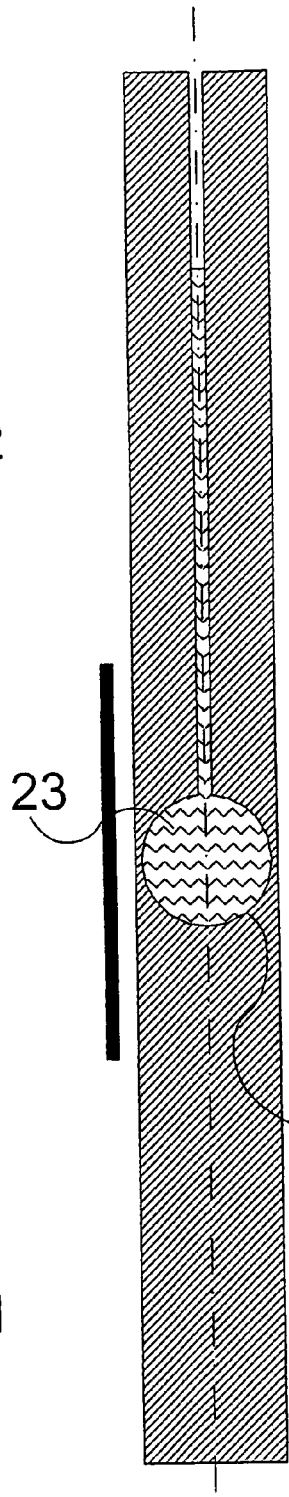
FIG. 2b a schematic cross-section through an NMR sample vessel according to the prior art according to [4]

FIG. 2b shows a sample vessel according to the patent of Fujita. The sample volume forms a spherical interface (24) with the vessel.

Figure 2C:
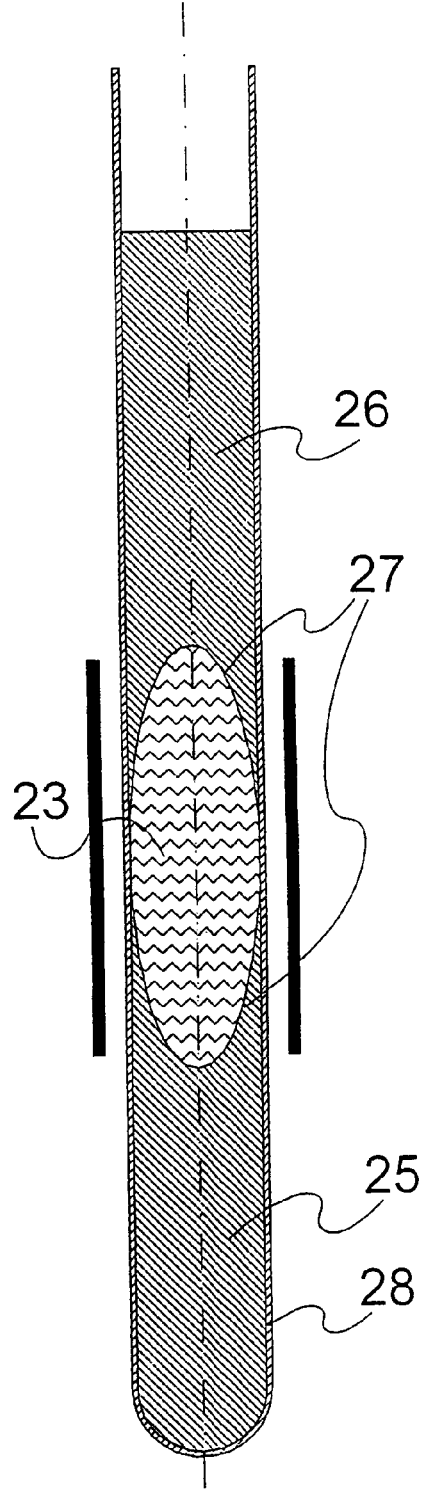
FIG. 2c a schematic cross-section through an NMR sample vessel according to the prior art according to [5]

FIG. 2c shows a sample vessel with a lower (25) and an upper (26) shaping insert, according to the patent of Cummings. The two shaping inserts form an interface toward the sample substance in the shape of a spheroid (27). The two shaping inserts can be placed in a conventional sample vessel (28).

Figure 3:
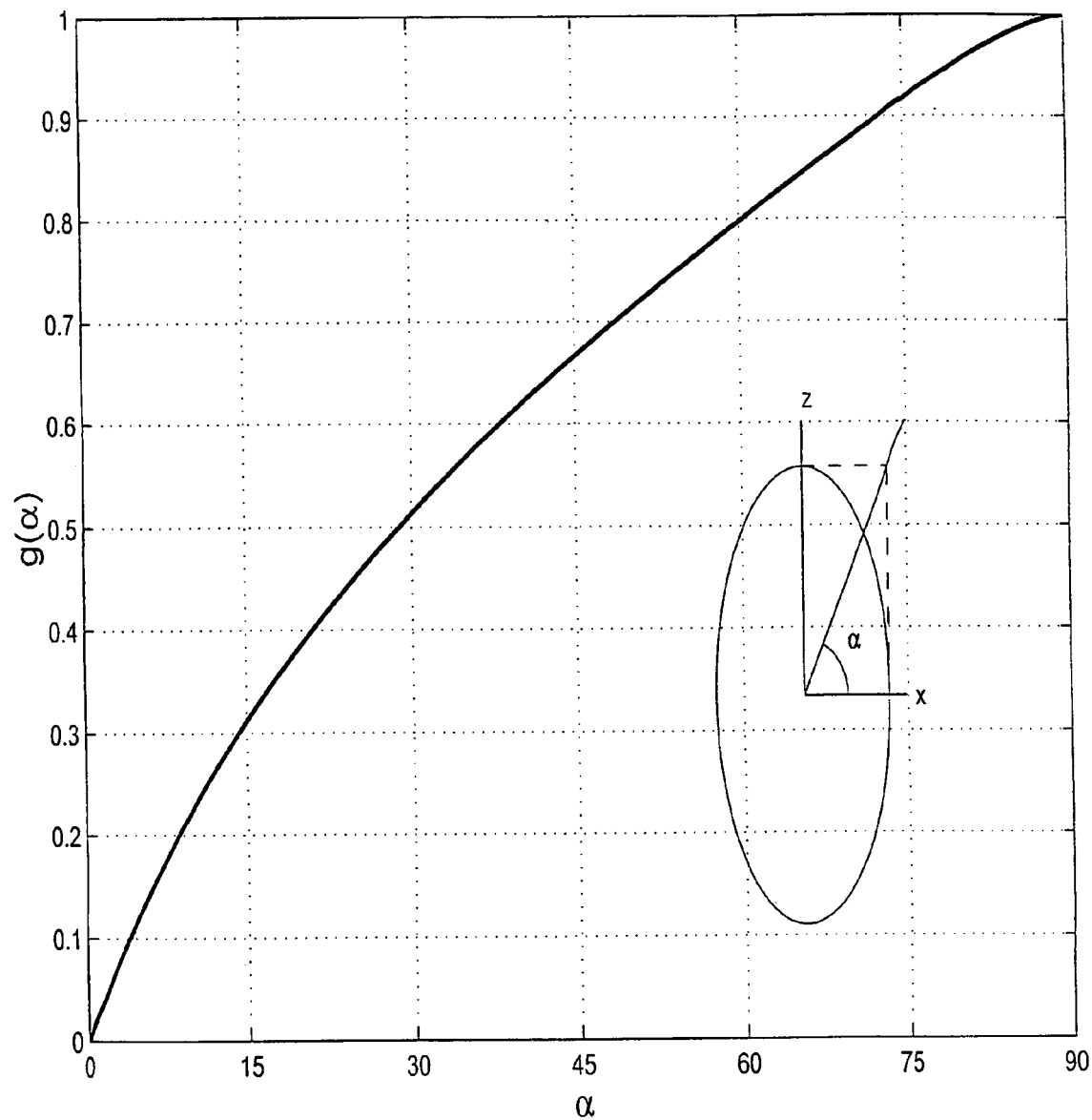
FIG. 3 a graph to explain the magnetic geometry factor g as a function of the aspect angle α.

FIG. 3 shows the magnetic geometry factor g for a spheroid, depending on the aspect angle α. The drawing inserted into the diagram illustrates the definition of the angle α. The axis labeled z is the axis of revolution.

FIG. 4 shows the relative field change caused by an interface with a jump in susceptibility χ between inside and outside. The interface is defined by a cylinder on one section and by a spheroid on another section.

Figure 4A:
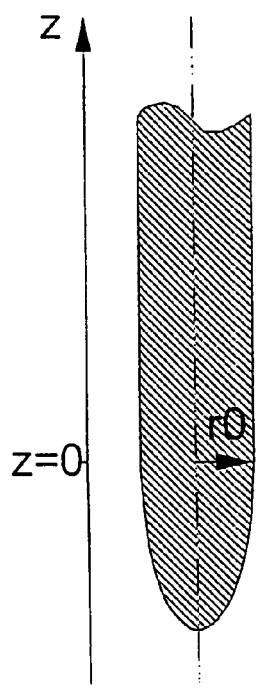
FIG. 4a a schematic longitudinal section through a solid of revolution.

FIG. 4a shows a longitudinal section through the solid of revolution. z=0 is the position in the z-direction at which the two geometries make the transition into each other. The radius shared by the cylinder and the spheroid is designated $r_0$.

Figure 4B:
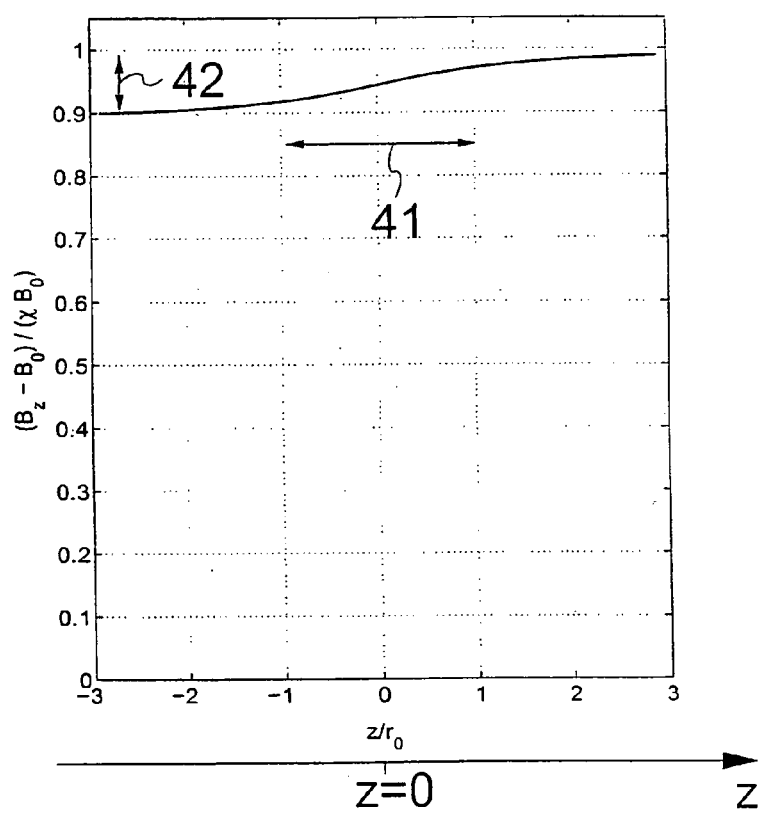

FIG. 4b shows the relative field change $(B_z-B_0)/(\chi B_0)$ on the axis of revolution. (41) indicates the extent of the transitional region between the field in the cylinder and the field in the spheroid; (42) denotes the difference between the field strength at some distance inside the ellipsoid and the field strength in the cylindrical part.

FIG. 5 shows an example of an inventive combination of the inner and outer interface of the sample vessel. In this example, below plane E0, a flat closed end of the inner surface (51) and a hemispherical closed end (i.e. an aspect angle of 45 degrees) of the outer surface (52) have been chosen.

Figure 5A:
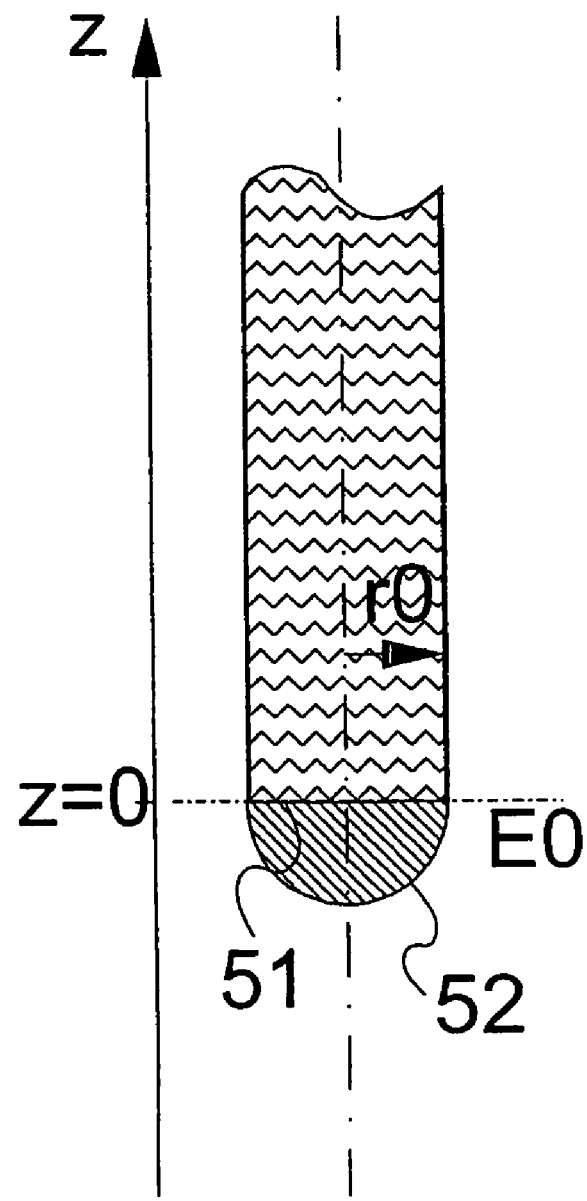
FIG. 5a a schematic cross-section through an inventive sample vessel with a flat inner closing surface.

FIG. 5a shows a longitudinal section through the sample vessel and the sample substance. The origin and direction of the z-axis, as they are used in FIG. 5b, are drawn to the left of the diagram.

Figure 5B:
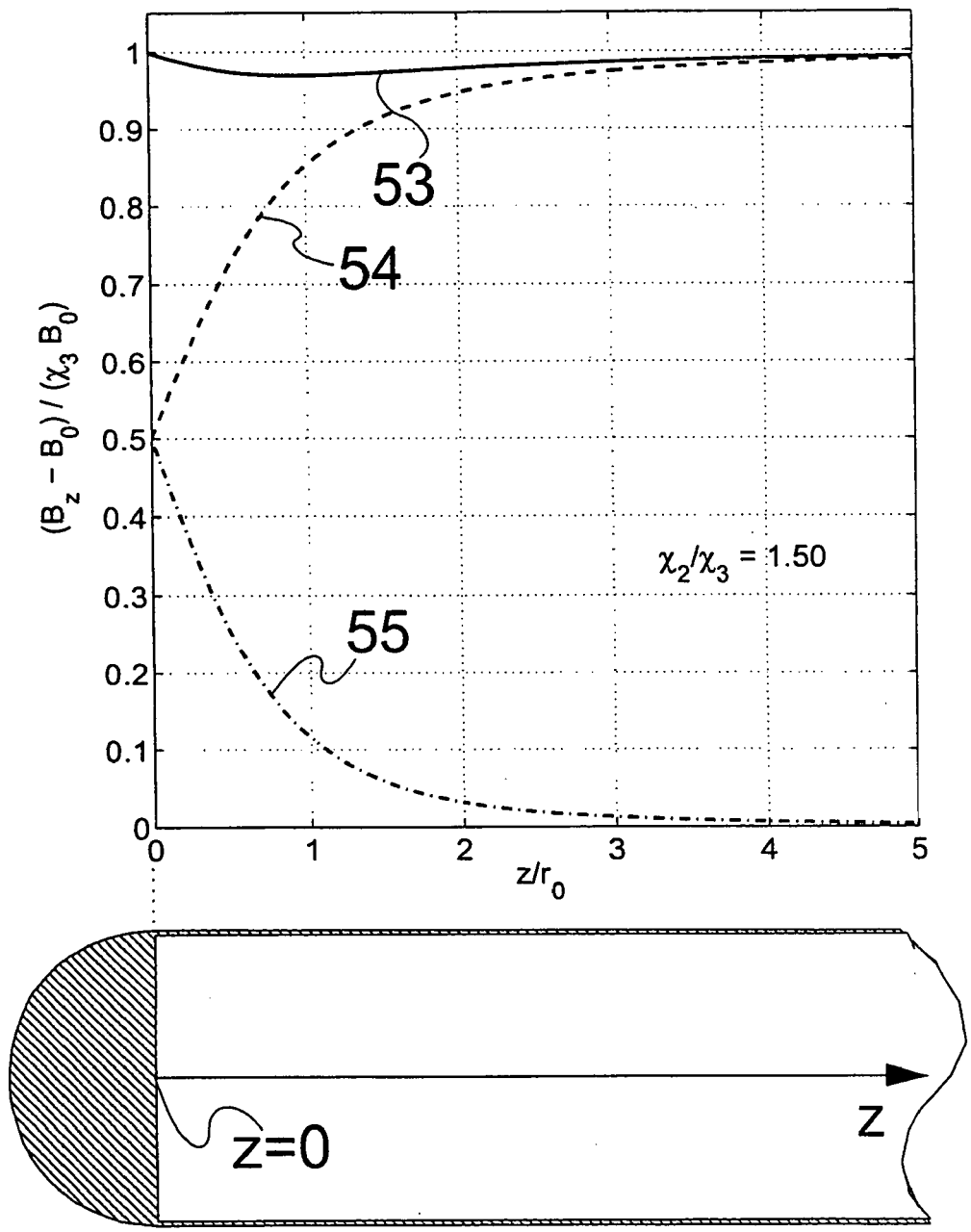

FIG. 5b shows a simulated relative field change $(B_z-B_0)/(\chi_3 B_0)$ inside the sample volume for the case in which the susceptibility of the sample substance and of the sample vessel meet the matching condition from equation 6, in which the susceptibility of the environment is $\chi_1=0$, and in which the ratio of the susceptibilities $\chi_2$ to $\chi_3$ is $$\frac{\chi_2}{\chi_3} = \frac{3}{2} \quad (53).$$

The field was calculated on the axis of the sample vessel. For comparison, the relative field change is also drawn for the case in which only the sample substance contributes toward the field change (54, also denoted F3) and equally for the case in which only the empty sample vessel contributes toward the field change (55).

The field inhomogeneities of (54) and (55) are essentially equal and opposite, so that in combination (53) a largely homogeneous field results.

Figure 5C:
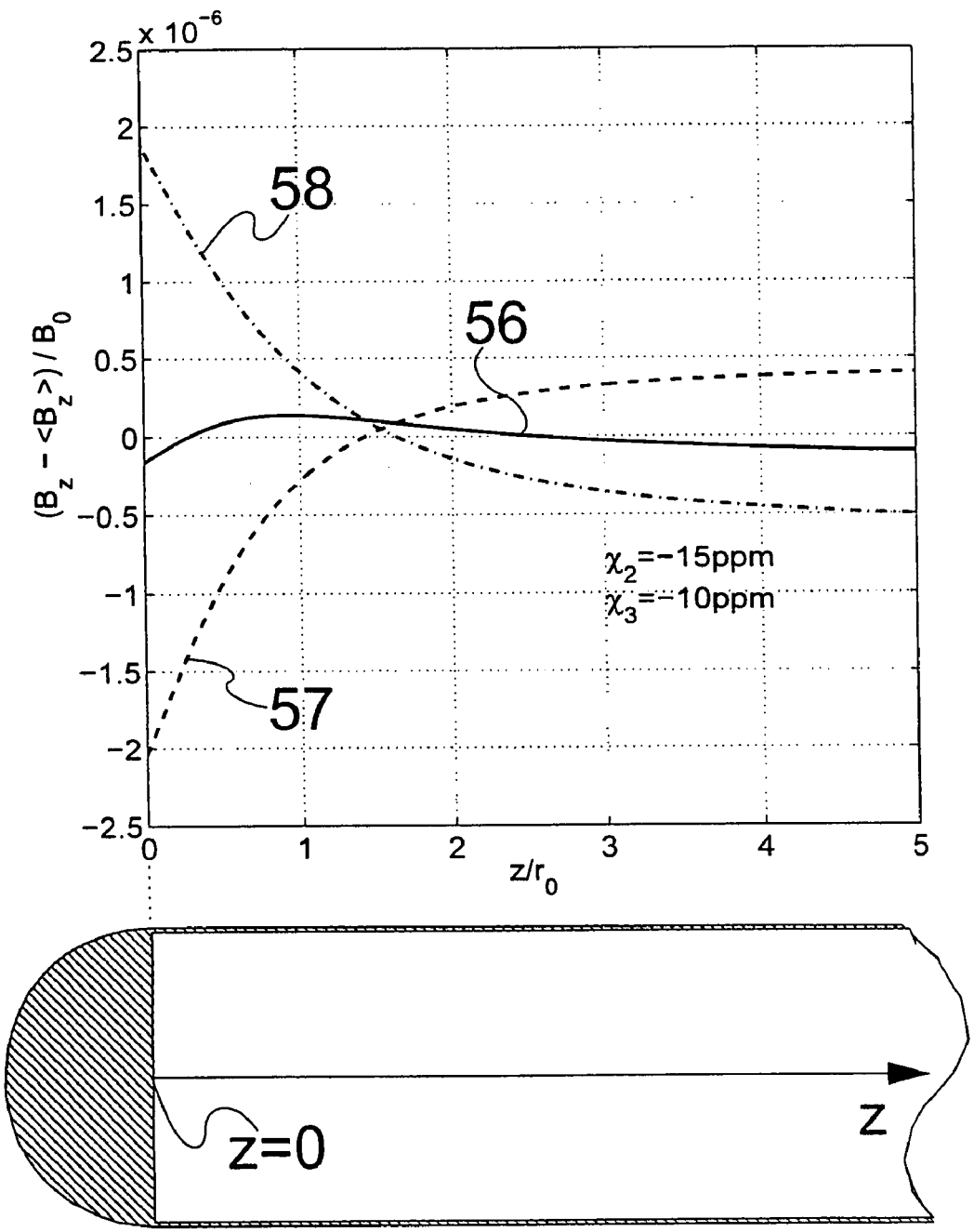

FIG. 5c shows relative field changes F1, F2 and (F1+F2) that are caused by the outer and inner interfaces of the example in FIG. 5b are shown. For the susceptibilities, the following values were chosen:

$\chi_1=0, \chi_2=-15$ ppm, $\chi_3=-10$ ppm.

(56): the resulting field change F1+F2

(57): the field change F2 that is caused by the inner interface $F2=(B_z^{(2)}-<B_z^{(2)}>)/B_0$ (58): the field change F1 that is caused by the outer interface $F1=(B_z^{(1)}-<B_z^{(1)}>)/B_0$ FIG. 6 shows a further example of an inventive combination of the inner and outer interface of the sample vessel. In this example, below plane E0, a hemispherical closed end of the inner surface (61) and a closed end of the outer surface in the shape of an elongated spheroid (62) were chosen.

Figure 6A:
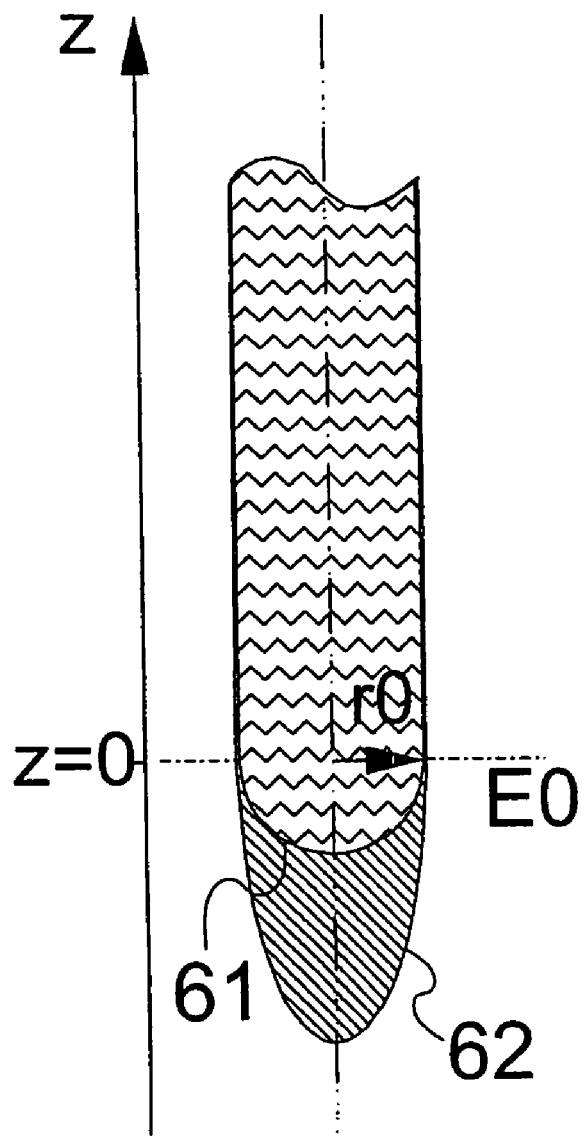
FIG. 6a a schematic cross-section through a further inventive sample vessel with an ellipsoidal inner closing surface.

FIG. 6a shows a longitudinal section through the sample vessel and the sample substance. The outer spheroid has an aspect angle of approx. 71 degrees. The origin and direction of the z-axis, as they are used in FIG. 6b, are drawn to the left of the diagram.

Figure 6B:
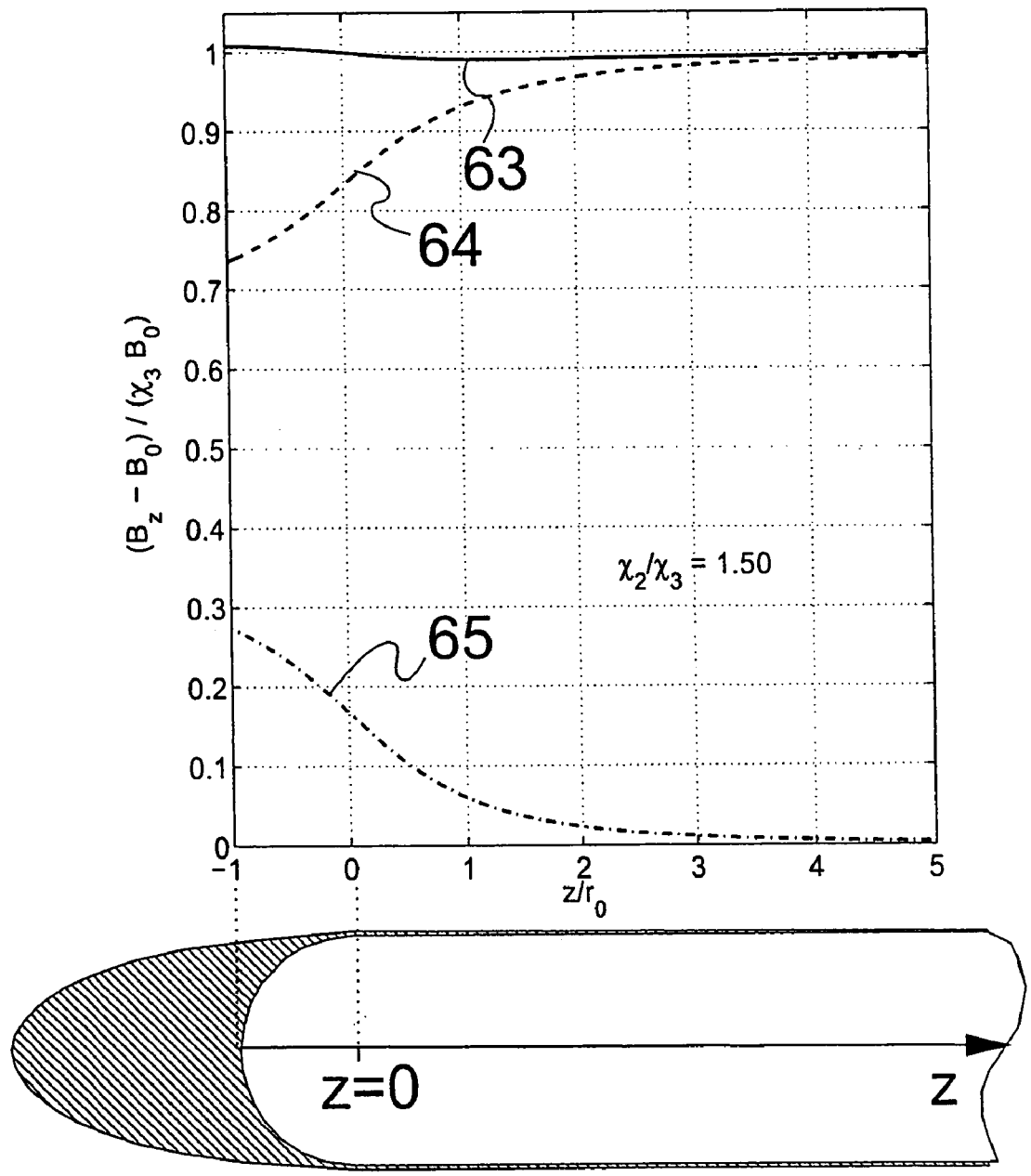

FIG. 6b shows a simulated relative field change $(B_z-B_0)/(\chi_3 B_0)$ inside the sample volume for the case in which the susceptibility of the sample substance and of the sample vessel meet the matching condition from equation 7 and in which the ratio of the susceptibilities $\chi_2$ to $\chi_3$ is $$\frac{\chi_2}{\chi_3} = \frac{3}{2} \quad (63).$$

The field was calculated on the axis of the sample vessel. For comparison, the relative field change is also drawn for the cases in which only the sample substance contributes toward the field change (64, also denoted F3) and for the case that only the pty sample vessel contributes toward the field change (65). The field inhomogeneities of (64) and (65) are essentially equal and opposite, so that in combination (63) a largely homogeneous field results.

Figure 6C:
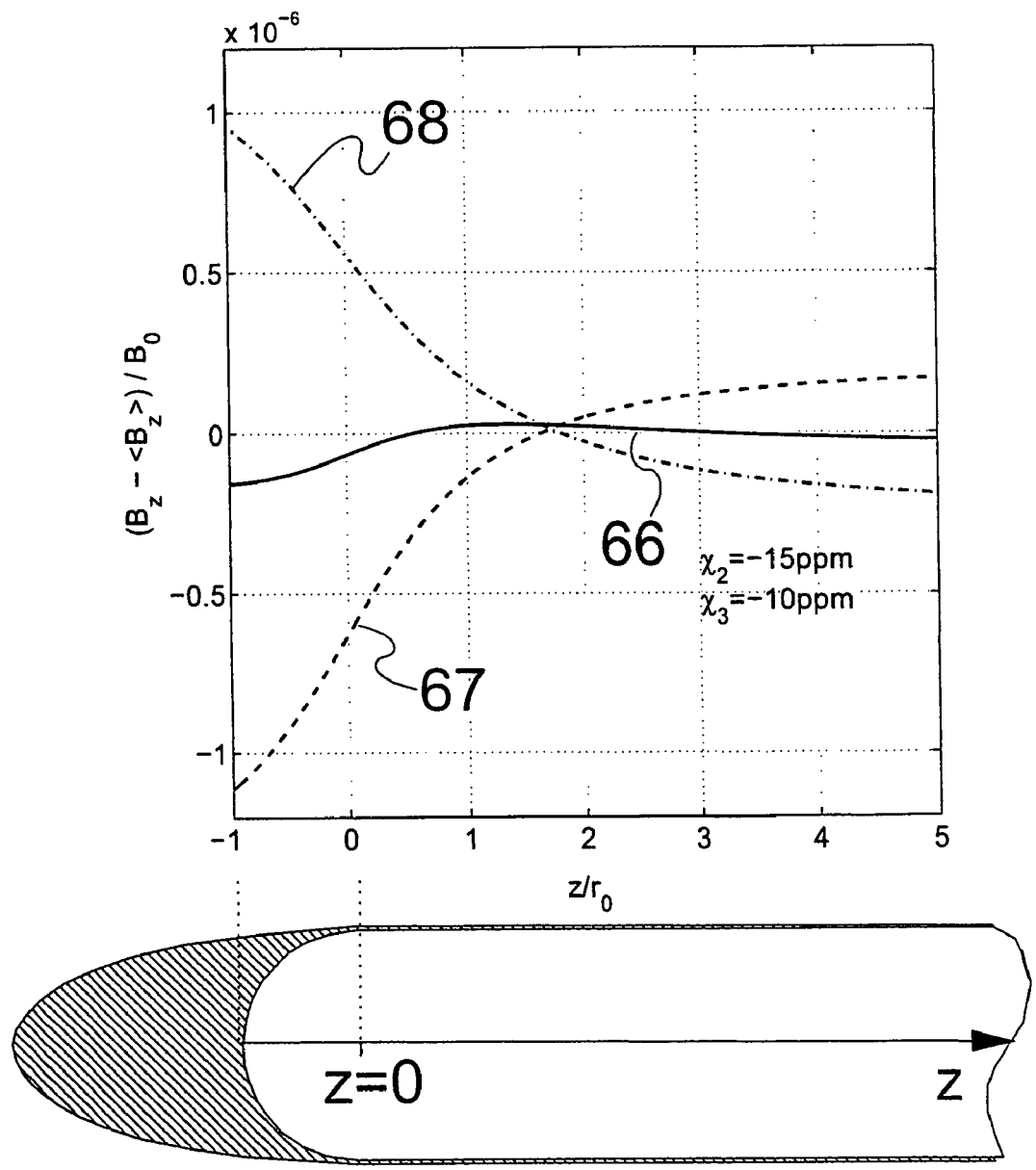

FIG. 6c shows the relative field changes F1, F2 and (F1+F2) that are caused by the outer and inner interfaces of the example in FIG. 6b are shown. For the susceptibilities, the following values were chosen:

$\chi_1=0, \chi_2=-15$ ppm, $\chi_3=-10$ ppm.

(66): the resulting field change (F1+F2)

Figure 7:
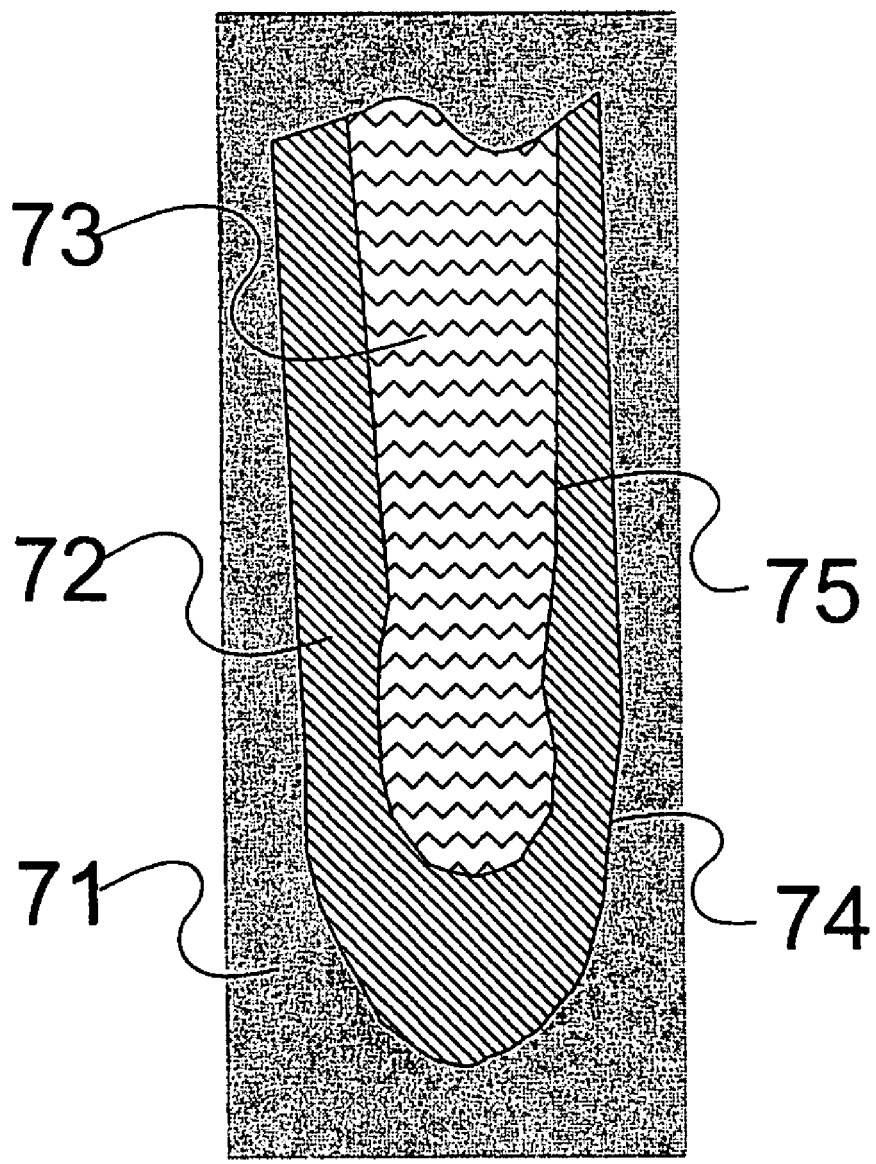
FIG. 7 a generalized sample vessel to explain the regions and interfaces according to the invention.
Figure 8:
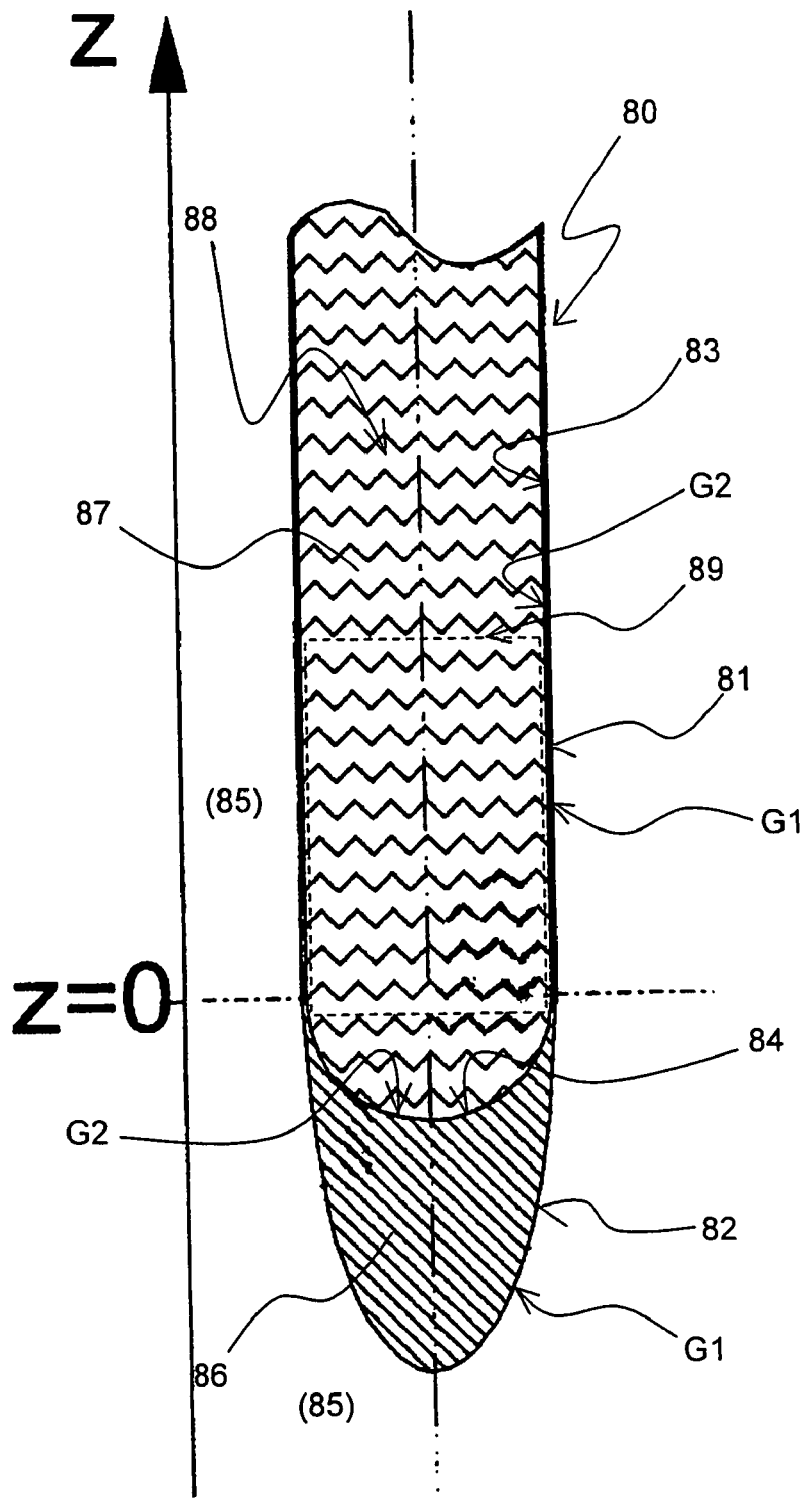
FIG. 8 an inventive sample vessel to explain the regions and interfaces according to the invention.

(67): the field change F2 that is caused by the inner interface $F2=(B_z^{(2)}-<B_z^{(2)}>)/B_0$ (68): the field change F1 that is caused by the outer interface $F1=(B_z^{(1)}-<B_z^{(1)}>)/B_0$ FIG. 7 shows regions and interfaces for the task in general terms:

(71): $\Omega_1$, environment with susceptibility $\chi_1$ (72): $\Omega_2$, vessel with susceptibility $\chi_2$ (73): $\Omega_3$, sample substance with susceptibility $\chi_3$ (74): $G_1$, interface between $\Omega_1$ and $\Omega_2$ (75): $G_2$, interface between $\Omega_2$ and $\Omega_3$ FIG. 8 shows regions and interfaces on an inventive sample vessel (cf. also sample vessel shown in FIG. 6a). An inventive NMR sample vessel 80 consists of a vessel material 86 with magnetic susceptibility $\chi_2$. Toward a sample volume 88 located inside that is filled with a liquid NMR sample 87 of magnetic susceptibility $\chi_3$, the vessel is limited by an inner interface $G_2$. Toward the outside, i.e. toward an environment 85 with magnetic susceptibility $\chi_1$, the sample vessel 80 is limited by an outer interface $G_1$. The outer interface G1 comprises an outer cylindrical surface 81 and an outer closing surface 82. The inner interface $G_2$ comprises an inner cylindrical surface 83 and an inner closing surface 84. The NMR sample vessel 80 is rotationally symmetric and has a circular cross-section in the example shown. In an NMR measurement, signals of the liquid measurement sample 87 are typically recorded from a measuring range 89.

A sample vessel made of a material with magnetic susceptibility $\chi_2$, to contain a sample substance with magnetic susceptibility $\chi_3 \neq \chi_2$ that is to be analyzed in a nuclear magnetic resonance (NMR) spectrometer has an inner interface $G_2$ toward the sample substance and an outer interface $G_1$ toward the environment, which exhibits magnetic susceptibility $\chi_1$. The geometries of the interface toward the sample substance and of the interface toward the environment are adapted to the jumps in susceptibility at the interfaces in such a way that, when the sample tube filled with the sample substance is inserted into the previously homogeneous magnetic field of an NMR spectrometer, the magnetic field remains essentially homogeneous within the sample substance.

The invention relates to a vessel for containing a substance that is analyzed in an NMR spectrometer.

NMR spectroscopy is a versatile tool for the chemical analysis of samples. A sample is placed in a strong static magnetic field and exposed to electromagnetic pulses. The reaction of the atomic nuclei in the sample is measured and analyzed.

The properties of the static magnetic field influence the quality of the measurement results. The best quality is generally achieved with the greatest magnetic field strength and with a high level of homogeneity of the static magnetic field.

The greatest field strengths for the static magnetic field are achieved using superconducting coil systems. For high-resolution NMR spectroscopy, field strengths up to 21 Tesla are used. The typical measurement configuration used in modern spectrometers comprises a cylindrical superconducting coil that produces a strong magnetic field that is parallel with the axis in a cylindrical interior space, and a number of shim coils, gradient coils and radio-frequency coils that are positioned at different radii around a sample vessel within this interior space. The sample vessel contains the substance to be examined. The material of the sample vessel must be electrically insulating (permitting the passage of radio-frequency radiation) and chemically inert.

The sample vessels can have the most varied shapes depending on the application. They are typically long, rotationally symmetric cylinders. There are two reasons for this choice of geometry. First, a cylindrical sample vessel only produces magnetic perturbations at its ends, which have little influence given sufficient distance from the measured volume. Second, rotationally symmetric sample vessels can be rotated during measurement, averaging out any non-rotationally symmetric field inhomogeneities over time, which reduces their influence on the measurement result. Typically, the portion of the sample volume that contributes to the measured signal in such a configuration is only half the total sample volume.

This additional sample liquid has the following disadvantages. If only a little of the sample substance is available or if the sample substance is very expensive, the sample substance can be diluted up to the sample volume necessary to fill the sample vessel. However, this results in an unwanted reduction in the measurement signal. In this case, it would be desirable to place the entire available sample substance in the region of high measurement sensitivity.

Moreover, this region can generate a spurious NMR signal, as in the case of the solvent suppression problem. The situation often occurs that the NMR signal of the substance to be analyzed (e.g. a protein) is several orders of magnitude weaker than the NMR signal of the solvent (e.g. water), so that it is impossible to detect the weak signal of interest in the presence of the spurious strong signal. There are methods for suppressing the solvent signal using suitable pulse sequences. The spurious NMR signals from this region, which is only used to reduce the magnetic perturbation of the sample vessel, can be greater than the actual useful signal in such cases.

Both problems can be reduced if the perturbations due to the end of the sample vessel are reduced, if the end can be brought nearer to the measured volume such that no sample substance is located in the edge area of the radio-frequency coil.

Two strategies are known to limit the sample substance to the central region of the radio-frequency coils while preventing inhomogeneities from arising in the static magnetic field. These are:

Adaptation of the magnetic susceptibility

Selecting an interface toward the sample substance with the shape of a spheroid.

No inhomogeneity of the magnetic field arises if the magnetic susceptibility remains constant over the interface between the sample substance and the adjacent material. Such a configuration is described in the patent of Zens [1]. Two cylindrical closed ends limit the sample substance from above and below to the region of the radio-frequency coil. The magnetic susceptibility $\chi_1$ of the closed ends or the magnetic susceptibility of the solvent used for the sample substance $\chi_2$ are influenced by a suitable choice of substance used in such a way that both susceptibilities have the same value. The interface between the closed ends and the surrounding gas is positioned sufficiently far away that the resulting field inhomogeneity exerts only a slight influence on the sample volume.

The patent of Shigezane [2] describes a sample vessel made of glass, in whose manufacture a sufficient quantity of a paramagnetic substance is admixed to the glass for the magnetic susceptibility $\chi_2$ of the vessel material precisely to match the susceptibility $\chi_3$ of the sample substance to be analyzed. Such a configuration is shown in FIG. 2a. Here too, the outer interfaces are far from the sample volume.

It is known [3] that the magnetic field inside a body that has the interface of an ellipsoid and consists of magnetically homogeneous material is homogeneous inside the body if a homogeneous magnetic field is applied from outside. The magnetic susceptibility $\chi_1$ of the body may in this case differ from the magnetic susceptibility $\chi_2$ of the sample substance—only the shape of the interface ensures that the magnetic field remains homogeneous.

In the patent of Fujita [4], a spherical cavity is left in a long, cylindrical sample vessel. Sample substance can be filled into this cavity through a capillary tube. Such a sample vessel is shown in FIG. 2b. The spherical shape is a special case of an ellipsoid. Cummings [5] solves the problem of the limited sample substance by using an upper and a lower shaping insert in a conventional sample tube. In an advantageous variant of this idea, the interface of the shaping inserts with the sample substance is chosen in the shape of a halved spheroid. A conventional sample vessel, in which two such shaping inserts are used, is shown in FIG. 2c. In this way, an outer homogeneous magnetic field is not distorted inside the sample substance and the shaping inserts match every sample substance—regardless of their magnetic susceptibility. As is the case for adaptation of the magnetic susceptibility, the distal end of the shaping insert has to be at a sufficient distance from the sample substance for the field inhomogeneity arising at this end to have no influence on the sample volume.

Conventional methods have the following disadvantages:

The remote ends (bottom, lid) of the sample vessel should ideally be far away in both methods because the susceptibility $\chi_1$ of the environment is generally clearly different from $\chi_2$ and $\chi_3$, which results in strong inhomogeneity in the vicinity of these ends.

The technology for manufacturing glassware with susceptibility correction is difficult.

The different solvents used in sample substances have different susceptibilities. A different raw material must therefore be used for each solvent, in the manufacture of the sample vessel.

The geometry of the inner surface cannot be defined in sections by spheroids. For example, a cylindrical shape with a rounded closed end already results in an inhomogeneity of the magnetic field. This situation is illustrated in FIG. 4.b.

For better understanding of the inventive idea, the term "interface" will be defined more precisely. An interface is defined as the surface that separates two regions with different magnetic susceptibilities $\chi$.

An NMR sample vessel has two interfaces, an inner and an outer interface. The inner interface is between the sample vessel with susceptibility $\chi_2$ and the sample substance (liquid sample) with susceptibility $\chi_3$. The outer interface is between the sample vessel and the environment (e.g. air) with susceptibility $\chi_1$.

The inventive idea is to choose a shape for the two interfaces such that the resulting inhomogeneities of the two interfaces largely cancel each other out within the sample substance. To solve this problem in the most general terms, it is first necessary to find a solution to the magnetostatic equations [8].

For given geometries, in this case determined by two interfaces $G_1$ (outer interface) and $G_2$ (inner interface) that separate the three regions $\Omega_1$ (environment), $\Omega_2$ (sample vessel wall), and $\Omega_3$ (liquid sample in the sample vessel) with the different susceptibilities $\chi_1, \chi_2,$ and $\chi_3$ (see FIG. 7), a solution to the equations $$\nabla \cdot B_i = 0, \nabla \times B_i = 0, \nabla \cdot H_i = 0, \nabla \times H_i = 0$$

must be found, where $B_i = \mu_r H_i = \mu_0(1+\chi_i)H_i$ applies in each region $\Omega_i$. Therefore potentials $\Psi_i$ with $\nabla^2 \Psi = 0$ and $H_i = -\nabla \Psi_i$ exist. Moreover, the discontinuity conditions at the interfaces must be fulfilled:

$$(\mu_2 H_2 - \mu_1 H_1) \cdot n = 0, \forall x \in G_1$$

$$(\mu_3 H_3 - \mu_2 H_2) \cdot n = 0, \forall x \in G_2$$

for the normal component of the fields and $$(H_2 - H_1) \cdot t = 0, \forall x \in G_1$$

$$(H_3 - H_2) \cdot t = 0, \forall x \in G_2$$

for the tangential components. The boundary conditions are given by the constant background field $H_0$ by $\lim(-\nabla \Psi_3) = H_0 e_z$ for large absolute magnitude x.

A numeric solution for given interfaces can be obtained using commercially available software. As an alternative to complicated FEM methods, approximation over the equivalent current density also provides good results for this problem ($|\chi| < 20$ ppm). In the examples, this approach will be explained in more detail because all examples were calculated by this method. By means of suitable objective functions and search algorithms, the two interfaces can be coordinated such that the perturbation within the measurement volume is minimized.

Herein, the advantage of the inventive idea over the prior art becomes apparent. In the above-stated cases, the influence of one of the interfaces is only reduced by positioning this interface far from the measured volume. By taking both interfaces into account, depending on the application, more compact geometries can be achieved that may save either glass or sample liquid but always save space.

Typically, a sample vessel comprises a cylindrical part and a closed end. The cylindrical surface is a surface that is defined by the surface of a generalized cylinder. Generalized cylinders include not only the familiar circular cylinder with a circular cross-sectional surface but also all other possible cross-sectional surface shapes. A cylindrical surface can thus be defined as a translationally invariant (=z-invariant) surface in the direction of the longitudinal axis of the cylinder.

The prior art includes closing surfaces that are approximately hemispherical, the wall thickness of the sample vessel being roughly constant in the region of these hemispheres. Flat closed ends produced with glass pieces are also possible. Reduction of the corresponding field inhomogeneity is achieved by a sufficiently large distance (approximately twice the diameter) of the closing surfaces from the observed region.

The background of the inventive idea is mutual compensation of the perturbations generated by the inner and outer interfaces. The two influences are permitted to have a specific magnitude but should cancel each other out to the greatest extent possible in the final result. The prior art, by contrast, has chosen the approach of reducing the magnitude of the influences of the two interfaces: the influence of the inner interface is reduced by choice of a suitable material and/or suitable shape whereas the influence of the outer interface is reduced by a sufficiently large distance from the measured volume.

From the given equations, it is possible—purely by calculation—to determine the influence on the sample volume of each interface. The standard deviation within the sample volume of the magnetic fields calculated in this way is a measure of the inhomogeneity of the magnetic field. This standard deviation can be calculated for the magnetic field caused by the inner interface, for the magnetic field caused by the outer interface, and for the magnetic field resulting from the combination of the two. The inventive sample vessel is characterized in that the combination of the two influences results in a considerable reduction of the inhomogeneity of the magnetic field, if the inhomogeneity resulting from the combination of the two influences is compared with the inhomogeneity of the magnetic field that is caused solely by the sample substance (jump from $\chi_1$ to $\chi_3$). This corresponds to a typical sample vessel according to prior art with a constantly small wall thickness.

We therefore introduce the following quantities:

$B_z^{(1)}$: z-component of the field that the outer interface $G_1$ causes, for a jump in susceptibility from $\chi_1$ to $\chi_2$ $B_z^{(2)}$: z-component of the field that the inner interface $G_2$ causes, for a jump in susceptibility from $\chi_2$ to $\chi_3$ $B_z^{(3)}$: z-component of the field that the inner interface $G_2$ causes, for a jump in susceptibility from $\chi_1$ to $\chi_3$ The inhomogeneity of the field is described by the deviation from the average value, the average value in the sample volume being of interest in this case:

$$<B_z^{(1)}> = \frac{1}{V}\int_V B_z^{(1)} dV, <B_z^{(2)}> = \frac{1}{V}\int_V B_z^{(2)} dV \text{ and } <B_z^{(3)}> = \frac{1}{V}\int_V B_z^{(3)} dV$$

The field strength $B_0$ of the external magnetic field is included in the above values as a factor. The result is relative field changes F1, F2 and F3 that are characteristic of the geometry and susceptibilities by normalization with respect to $B_0$:

$$F1 = (B_z^{(1)} - <B_z^{(1)}>)/B_0$$

$$F2 = (B_z^{(2)} - <B_z^{(2)}>)/B_0$$

$$F3 = (B_z^{(3)} - <B_z^{(3)}>)/B_0$$

Compensation of the inhomogeneities can be deemed to occur when F1 and F2 separately each describe a significant inhomogeneity, but their combined effect F1+F2 exhibits a clearly reduced inhomogeneity that is smaller than the perturbation F3 of the sample volume by itself.

An inhomogeneity that is significant for high-resolution NMR can be defined by the argument of Shigezane: In [2] (column 1, lines 39-42), one requires the difference between the two susceptibilities at a flat interface to be less than 10% of the sample susceptibility, so that the resulting field inhomogeneity can be compensated for by means of shim coils. In the case of the sample geometry in [2], the relative field change F2 at the interface (where F2 is at maximum) is $F2 = 0.5 \cdot (\chi_3 - \chi_2)$. If the typical value $\chi_3 = -10 \cdot 10^{-6}$ is inserted for the sample susceptibility, in the case of a 10% deviation of the vessel susceptibility $\chi_2$ from the sample susceptibility $\chi_3$, the maximum of F2 is just about $\max(F2) = 0.5 \cdot 10^{-6}$. Relative field changes that exceed this value are unacceptable in conventional designs and require compensation.

For evaluation of the inhomogeneity of the field, not only is the largest deviation from the average value important but the overall situation in the sample volume V must also be assessed. The suitable value is the standard deviation of the relative field change in the sample volume:

$$\sqrt{\int_V (F1+F2)^2 \, dV}$$

The inhomogeneity is considerably reduced by the compensatory effect of F1 if the standard deviation of the combined relative field deviations (F1+F2) is less than the standard deviation of the relative field change F3 of the inner interface for the sample liquid alone:

$$\sqrt{\int_V (F1+F2)^2 \, dV} \leq 0.9 \cdot \sqrt{\int_V (F3)^2 \, dV}$$

Ideal compensation would eliminate the standard deviation of (F1+F2) altogether.

For certain applications, it is important for the greatest deviation from the average value of the field not to exceed a certain critical value. In such cases, the compensation can be set such that a condition of type $$|F1+F2| \leq 0.5 \cdot 10^{-6}$$

is satisfied at all points in the sample volume.

The instant invention proposes the following new aspects:

1. In contrast to the prior art, the outer interface of the sample vessel is not positioned as far away as possible, but used in the vicinity of the inner interface to produce a field-strength distribution in the sample volume by means of its shape and of the jump in susceptibility toward the environment that, combined with the field inhomogeneity caused by the inner interface, nearly results in a homogeneous field.

2. Materials with such diverging susceptibilities as water and quartz glass are permitted to form an interface in the immediate vicinity of the RF coil as this does not impair the quality of the NMR spectrum.

3. The technically difficult production of a vessel with the same susceptibility as the sample substance to be analyzed by admixture of a strongly paramagnetic substance can be replaced by the technically more easily achieved shaping of the sample vessel, e.g. by grinding. Sample vessels can be manufactured to match solvents with various susceptibilities from the same raw material.

Good results can already be achieved with relatively simple approximations. Therefore we will look only at simple geometries to demonstrate the effect of this idea. We will make use of the fact that the magnitude of the field within an ellipsoid exists as a closed function.

If a body with the shape of a spheroid with an axis of revolution parallel to the z-axis and homogeneous magnetic susceptibility $\chi$ is placed in an external, homogeneous magnetic field $\vec{B}_0 = (0,0,B_0)$ parallel to the z-axis, the magnetic field inside the body is homogeneous and the z-component of the resulting field inside the body can be written as $$B_z = B_0(1+\chi g) \quad (1)$$

where g is a geometry factor that is defined by the ratio of the semi-axes of the spheroid [3].

Here are three examples of spheroids by way of illustration: In the case of a plate that extends infinitely in both directions perpendicular to the external field, the field inside the plate is equal to the external field, irrespective of the susceptibility, i.e. g=0. A long, thin cylinder parallel to the external field has an internal field corresponding to its susceptibility: $B_z=B_0(1+\chi)$, i.e. g=1. In a sphere, the susceptibility does not take full effect and g=2/3.

According to Ulrich et al. [6] and Osborn [7], for a spheroid with semi-axes $\alpha_x=\alpha_y$ and $\alpha_z=q\alpha_x$, the geometry factor g can be written as a function of q:

$$g(q) = 1 - \frac{q \cdot \ln(q+\sqrt{q^2-1})}{(q^2-1)^{3/2}} + \frac{1}{q^2-1} \quad (2)$$

This function is real for $q \in [0,\infty]$ and has a removable singularity at q=1. g(1)=2/3 applies. In FIG. 3, g is represented as a function of the aspect angle $\alpha$ of the spheroid. The relation between the aspect angle and the ratio of the semi-axes is defined by $$\tan\alpha = q = \frac{a_z}{a_x}.$$

Sample vessels for NMR spectroscopy are preferably cylindrical over a long section because of the probe geometry and the devices for rotation of the vessel. One freedom that remains in their design is the choice of the shape of the end of the sample vessel. It is an obvious solution to have the cylindrical part make a transition to an elongated spheroid. However, the magnetic field inside such a sample vessel is no longer homogeneous. In particular, in the vicinity of the transition from the cylinder to the spheroid, the magnetic field changes to a relatively great extent depending on the position. FIG. 4.b shows the field-strength distribution along the axis of a body with such a geometry. The field-strength distribution along the axis of a cylindrical body closed by a spheroid can be essentially characterized by three parameters:

1. The z-position with the steepest field gradient. This is the position at which the cylindrical surface makes a transition to the elliptical surface. The z-axis in the figure is chosen such that z=0 applies at this position.

2. The extent of the transitional region in the z-direction. This value is scaled with the cylinder radius (41 in FIG. 4.b).

3. The difference between the field strength in the ellipsoid and the field strength in the cylindrical part (42 in FIG. 4.b).

The field strength on the axis of symmetry directly behind the jump is determined by formula 1, while the field strength in the cylindrical part is only determined by the jump in susceptibility $\chi$ from inside to outside the body.

The field inside the sample substance becomes homogeneous if the inhomogeneities that are caused by the two interfaces are equal but opposite.

In the special case in which the two interfaces are a cylinder closed by a spheroid, the three above-stated parameters result in the following conditions having to be met:

1. The transition to the ellipsoid must be made at the same z-position for the inner interface and the outer interface (i.e. maximum gradient at the same position)

2. The radii that are perpendicular to the axis of revolution of the two interfaces (cylinder radius and semi-axis $\alpha_x$) must differ only slightly, i.e. the transitional region is of comparable size.

3. The difference, i.e. the third parameter, of the two interfaces must be equal but with opposite signs. This results in the matching condition $$(\chi_2-\chi_1)(1-g(\alpha_1))=-(\chi_3-\chi_2)(1-g(\alpha_2)). \quad (3)$$

In case of $\chi_1=0$ (vacuum or nitrogen outside) the ratio of the susceptibilities is given by:

$$\frac{\chi_2}{\chi_3} = \frac{1-g(\alpha_2)}{g(\alpha_1)-g(\alpha_2)} \quad (4)$$

Ellipsoid 2 must be within ellipsoid 1 everywhere, from which it follows that $0<\alpha_2 \leq \alpha_1 <90°$, and $0 \leq g(\alpha_2)<g(\alpha_1) \leq 1$ follows from the monotonic nature of g. Therefore, both $(1-g(\alpha_2))>0$ and $(g(\alpha_1)-g(\alpha_2))>0$ apply, i.e. the signs of $\chi_2$ and $\chi_3$ must be identical before the matching condition can be fulfilled. Moreover, $$|\chi_2| \geq |\chi_3| \quad (5)$$

must be satisfied, i.e. for the sample vessel only susceptibilities whose absolute values are larger than that of the sample substance are acceptable.

The following examples show how, just by applying the one equation of the matching condition, compensation can already be achieved with the inhomogeneity demanded in [2]. The calculated field-strength distributions in FIGS. 5*a-c* and FIGS. 6*a-c* have been determined by the equivalent current density method to reveal how well even this simple approximation works.

If the intention is to limit the volume of the sample substance as close as possible to the limit of the RF coil, a flat end of the inner interface is desirable. So, let $\alpha_2=0$ and therefore $g(\alpha_2)=0$. The matching condition is then $$\chi_2 = \frac{1}{g(\alpha_1)} \chi_3 \quad (6)$$

and, for the case of a hemisphere (i.e. $\alpha_1=45°$) outside, it follows that $$\chi_2 = \frac{3}{2}\chi_3.$$

A fine correction for optimum adaptation of the sample vessel to a sample substance can be performed by technically easily implemented correction to the shape of the outer surface (i.e. to the factor $g(\alpha_1)$).

FIG. 5*b* shows the field-strength distribution in the sample volume that can be achieved by fulfilling this matching condition (53). For comparison, the field-strength distribution is shown that would be established without adaptation to the outer interface (technically feasible by a sample vessel having thin walls everywhere) (54).

In [2], it is demanded that the difference between two susceptibilities at a flat interface be less than 10% of the sample susceptibility, so that the resulting field inhomogeneity can be compensated for by means of shim coils. In this example of an inventive configuration, the hemispherical outer surface compensates for a jump in susceptibility of 50% of the sample susceptibility: this enables materials with much more widely diverging susceptibilities to be combined!

In the case of a hemisphere as the closed end for the inner surface, $\alpha_2=45°$ applies and therefore $$g(\alpha_2) = \frac{2}{3}.$$

The matching condition is then $$\chi_2 = \frac{1}{3g(\alpha_1)-2}\chi_3 \quad (7)$$

If, for example, $$\chi_2 = \frac{3}{2}\chi_3$$

is chosen, the matching condition for $\alpha_1 \approx 71°$ is met, i.e. q≈3.

FIG. 6 shows the field-strength distribution in the sample volume that can be achieved when this matching condition is fulfilled. For comparison, the field-strength distribution is shown that would be set without adaptation to the outer interface (technically feasible by a sample vessel having thin walls everywhere).

High-resolution NMR spectroscopy is frequently used to analyze substances dissolved in water. A further frequently used solvent is acetone. For the manufacture of the sample vessels, borosilicate glass is especially suitable. Quartz glass is also used. The susceptibility values of these substances are:

Water: $-9.05 \cdot 10^{-6}$

Acetone: $-5.80 \cdot 10^{-6}$

Borosilicate glass: $-11.0 \cdot 10^{-6}$

Quartz glass: $-15.0 \cdot 10^{-6}$

For example, if a flat end is chosen for the inner surface, insertion of the susceptibility values in formula 7 yields the following aspect angles of the outer ellipsoids, at which the field becomes homogeneous. Depending on the combination of solvent with material of the sample vessel, the following results:

Water/borosilicate glass: 63°

Acetone/borosilicate glass: 32°

Water/quartz glass: 38°

Acetone/quartz glass: 20°.

Now, if different solvents are used in an NMR laboratory, it is possible to provide a number of sample vessels, all consisting of the same material, but having differing shapes. For each measurement, the suitable type of sample vessel to match the magnetic susceptibility $\chi_2$ of the sample substance is then chosen, so that the resulting field inhomogeneity remains minimal.

The influence of an interface of any shape on the magnetic field can be modeled as follows:

Let the coordinate system be defined such that the external magnetic field $B_0$ only has a z-component. The region in which the two materials are located is then divided into slices of thickness dz. In each slice perpendicular to $B_0$, a limiting contour now runs in the x-y-plane. Let a current $$I = \frac{B_0}{\mu_0}(\chi_i - \chi_a) \cdot dz$$

flow along this contour, where $\chi_i$ is the susceptibility of the material entirely within the contour and $\chi_a$ is the susceptibility of the other material and the current has a positive sign due to the positive direction of rotation with respect to the z-axis. The magnetic field produced by the currents determined in this way can be calculated for any points in space by applying the Biot-Savart equation.

The distributions shown in FIGS. 4, 5 and 6 of the z-component of the magnetic field were calculated in this way for points on the axis of revolution.

REFERENCES

[1] A. P. Zens, Controlled Susceptibility Plugs. U.S. Pat. No. 4,549,136 (1985).
[2] M. Shigezane et al., Sample Tube for Nuclear Magnetic Resonance Apparatus. U.S. Pat. No. 5,831,434 (1998).
[3] J. C. Maxwell, A Treatise on Electricity and Magnetism, Dover Publications, New York, 1954, third edition, Vol. 2, pp. 66-70
[4] M. Fujita, Japanese Patent No. JP6249934 (1994).
[5] M. D. Cummings, NMR Sample Shaper. U.S. Pat. No. 5,302,900 (1994).
[6] R. Ulrich et al., Susceptibility corrections in solid state NMR experiments with oriented membrane samples: Part II: Theory, J. Magn. Reson. 164, 115-127 (2003).
[7] J. A. Osborn, Demagnetizing Factors of the General Ellipsoid, Phys. Rev. 67, 351-357 (1945).
[8] J. D. Jackson, Classical Electrodynamics, John Wiley, New York, 1998, Third Edition.

We claim:

1. A sample vessel for NMR measurements, the vessel having a vessel material with a magnetic susceptibility $\chi_2$ and placed in an environment having a magnetic susceptibility $\chi_1$, the vessel containing a liquid sample having a magnetic susceptibility $\chi_3$, the vessel comprising:

an outer interface that limits the sample vessel with respect to the environment, the outer interface having an outer cylindrical surface shaped as cylinder envelope with an axis of symmetry which is aligned parallel to a z-direction and an outer closing surface that closes the sample vessel at a lower end thereof and which is contiguous to the outer cylindrical surface, wherein, when an external homogeneous magnetic field $B_0$ parallel to the z-axis is applied, the outer interface causes, due to a jump in susceptibility from $\chi_1$ to $\chi_2$ in the region of the sample volume, a field $B_z^{(1)}$ with an average value in the sample volume $<B_z^{(1)}>$ and therefore a first relative field change $F1=(B_z^{(1)}-<B_z^{(1)}>)/B_0$ that, at least in a part of the sample volume, has an absolute value of no less than $0.5 \cdot 10^{-6}$; and an inner interface that limits the sample vessel with respect to a sample volume, the inner interface having an inner cylindrical surface shaped as a cylinder envelope with an axis of symmetry which is aligned parallel to the z-direction and an inner closing surface that closes the sample volume at a lower end thereof and which is contiguous to the inner cylindrical surface, wherein, when an external homogeneous magnetic field $B_0$ parallel to the z-axis is applied, the inner interface causes, due to a jump in susceptibility from $\chi_2$ to $\chi_3$ in the region of the sample volume, a field $B_z^{(2)}$ with an average value in the sample volume $<B_z^{(2)}>$ and therefore a second relative field change $F2=(B_z^{(2)}-<B_z^{(2)}>)/B_0$ that, at least in a part of the sample volume, has an absolute value of no less than $0.5 \cdot 10^{-6}$, wherein the first relative field change F1 and the second relative field change F2 largely cancel each other out in the sample volume V so that the following applies $$\sqrt{\int_V (F1+F2)^2 \, dV} \leq 0.9 \cdot \sqrt{\int_V (F3)^2 \, dV}$$

, wherein the inner interface would cause, due to a jump in susceptibility of $\chi_1$ to $\chi_3$ in the region of the sample volume, a field $B_z^{(3)}$ with an average value in the sample volume $<B_z^{(3)}>$ and therefore a third relative field change $F3=(B_z^{(3)}-<B_z^{(3)}>)/B_0$.

2. The sample vessel of claim 1, wherein $$\sqrt{\int_V (F1+F2)^2 \, dV} \leq 0.5 \cdot \sqrt{\int_V (F3)^2 \, dV}.$$

3. The sample vessel of claim 2, wherein $$\sqrt{\int_V (F1+F2)^2 \, dV} \leq 0.1 \cdot \sqrt{\int_V (F3)^2 \, dV}.$$

4. The sample vessel of claim 1, wherein throughout the sample volume $|F1+F2| \leq 0.5 \cdot 10^{-6}$.

5. The sample vessel of claim 4, wherein throughout the sample volume $|F1+F2| \leq 0.1 \cdot 10^{-6}$.

6. The sample vessel of claim 1, wherein $\chi_2\chi_3 > 0$ and $|\chi_2| > |\chi_3|$.

7. The sample vessel of claim 6, wherein $|\chi_2|/|\chi_3| > 1.1$.

8. The sample vessel of claim 1, wherein the sample vessel is made of borosilicate glass or quartz glass.

9. The sample vessel of claim 1, wherein the sample vessel is designed for an environment of air, nitrogen gas, an inert gas, or argon with respect to $\chi_1$.

10. The sample vessel of claim 1, wherein sample vessel is designed for a liquid sample solvent of water or acetone with respect to $\chi_3$.

11. The sample vessel of claim 1, wherein the sample vessel is rotationally symmetric with respect to the z-direction.

12. The sample vessel of claim 1, wherein said outer closing surface and said inner closing surface are each constituted as a hemi-ellipsoid, wherein the hemi-ellipsoid is a spheroid halved perpendicular to an axis of revolution thereof, wherein said outer interface and said inner interface each make a transition from said closing surface to said cylindrical surface at a same position in the z-direction, wherein the following approximately applies:

$(\chi_2-\chi_1)(1-g(\alpha_1))=-(\chi_3-\chi_2)(1-g(\alpha_2))$, with $\alpha_1$=aspect angle of said hemi-ellipsoid of said outer closing surface, $\alpha_2$=aspect angle of said hemi-ellipsoid of said inner closing surface, $$g(\alpha_1) = 1 - \frac{\tan(\alpha_1) \cdot \ln\left(\tan(\alpha_1) + \sqrt{\tan(\alpha_1)^2 - 1}\right)}{(\tan(\alpha_1)^2 - 1)^{3/2}} + \frac{1}{\tan(\alpha_1)^2 - 1},$$

$$g(\alpha_2) = 1 - \frac{\tan(\alpha_2) \cdot \ln\left(\tan(\alpha_2) + \sqrt{\tan(\alpha_2)^2 - 1}\right)}{(\tan(\alpha_2)^2 - 1)^{3/2}} + \frac{1}{\tan(\alpha_2)^2 - 1}.$$

13. The sample vessel of claim 12, wherein $(\chi_2-\chi_1)(1-g(\alpha_1))=-(\chi_3-\chi_2)(1-g(\alpha_2))\cdot U,$ where $0.95 \leq U \leq 1.05$.

14. The sample vessel of claim 13, wherein $0.99 \leq U \leq 1.01$.

15. The sample vessel of claim 1, wherein said inner closing surface and said outer closing surface exhibit a maximum distance of 3 mm in the z-direction.

16. A method for determining the shape of said outer and inner interfaces of the NMR sample tube of claim 1, the method comprising the steps of:
  a) defining parameters that determine the shape of the outer and inner interfaces;
  b) defining a cost function that can be calculated for any combination of parameters and is constituted such that smaller values of the cost function describe an improvement in the field homogeneity, wherein the cost function includes a term of the form;

$$-\sqrt{\int_V (F1 + F2)^2 \, dV} \; ; \text{and}$$

c) applying a numerical optimization algorithm to determine a set of parameters that define a minimum of the cost function.

\* \* \* \* \*